(12) United States Patent
Kang et al.

(10) Patent No.: US 7,782,016 B2
(45) Date of Patent: Aug. 24, 2010

(54) HYBRID-TYPED BATTERY PACK OPERATED IN HIGH EFFICIENCY

(75) Inventors: Juhyun Kang, Daejeon (KR); JongMin Park, Daejeon (KR); Do Yang Jung, Hwaseong-si (KR); John E. Namgoong, Daejeon (KR)

(73) Assignee: LG Chem, Ltd. (KR)

( * ) Notice: Subject to any disclaimer, the term of this patent is extended or adjusted under 35 U.S.C. 154(b) by 633 days.

(21) Appl. No.: 11/625,457

(22) Filed: Jan. 22, 2007

(65) Prior Publication Data
US 2007/0262746 A1 Nov. 15, 2007

(30) Foreign Application Priority Data
Feb. 20, 2006 (KR) .................. 10-2006-0015995

(51) Int. Cl.
*H02J 7/00* (2006.01)
(52) U.S. Cl. .................. 320/126; 320/128; 320/162
(58) Field of Classification Search .......... 320/110, 320/112, 126, 128, 134, 162–164
See application file for complete search history.

(56) References Cited

U.S. PATENT DOCUMENTS 6,452,362 B1 * 9/2002 Choo .................. 320/116
6,707,271 B2 * 3/2004 Kitagawa .............. 320/134
7,494,729 B2 * 2/2009 Odaohhara ............. 429/9
2005/0116686 A1 * 6/2005 Odaohhara ............. 320/116

FOREIGN PATENT DOCUMENTS

JP 06124720 5/1994
JP 2004111242 4/2004

OTHER PUBLICATIONS

Machine Translation for JP 06-124720.*

* cited by examiner

*Primary Examiner*—Edward Tso
*Assistant Examiner*—Ramy Ramadan
(74) *Attorney, Agent, or Firm*—Cantor Colburn LLP

(57) ABSTRACT

Disclosed herein is a battery pack including a module assembly consisting of two or more unit modules having different outputs and capacities, a detection unit for detecting the current and/or the voltage of the battery pack and transmitting the detected current signal and/or the detected voltage signal to a control unit, the control unit for selecting an optimal unit module from the module assembly based on the current signal and/or the voltage signal received from the detection unit, and a switching unit for electrically connecting a specific unit module of the module assembly to an external input and output terminal under the control of the control unit. In the battery pack according to the present invention, an appropriate unit module is selected and operated depending upon the operating conditions of a device in which the battery pack is mounted, whereby the operating efficiency of the battery pack is improved.

10 Claims, 3 Drawing Sheets

HYBRID-TYPED BATTERY PACK OPERATED IN HIGH EFFICIENCY

FIELD OF THE INVENTION

The present invention relates to a hybrid-type battery pack that is operated with high efficiency depending upon the conditions of devices, and, more particularly, to a complex-type or hybrid-type battery pack including two unit modules having different outputs and capacities, a voltage detection unit, a control unit, and a switching unit, wherein an appropriate unit module is selected and operated depending upon the operating conditions of a device in which the battery pack is mounted, whereby the operating efficiency of the battery pack is improved.

BACKGROUND OF THE INVENTION

One of the biggest problems caused from vehicles using fossil fuel, such as gasoline and diesel oil, is creation of air pollution. A technology of using a secondary battery, which can be charged and discharged, as a power source for vehicles has attracted considerable attention as one method of solving the above-mentioned problem. As a result, electric vehicles (EV), which are operated using only a battery, and hybrid electric vehicles (HEV), which jointly use a battery and a conventional engine, have been developed. Some of the electric vehicles and the hybrid electric vehicles are now being commercially used. A nickel-metal hydride (Ni-MH) secondary battery has been mainly used as the power source for the electric vehicles (EV) and the hybrid electric vehicles (HEV). In recent years, however, the use of a lithium-ion secondary battery has been attempted.

High output and large capacity are needed for such a secondary battery to be used as the power source for the electric vehicles (EV) and the hybrid electric vehicles (HEV). For this reason, a plurality of small-sized secondary batteries (unit cells) are connected in series or in parallel with each other so as to construct a battery pack.

FIG. 1 is a typical view schematically illustrating a conventional battery pack including unit modules having the same output and capacity characteristics.

Referring to FIG. 1, a conventional battery pack 100 includes a unit module 120 comprising a plurality of battery cells 110 having the same output and capacity, a control unit 130 for controlling the operation of the unit module 120, and an external input and output terminal 140 for connecting the control unit 130 to a device (not shown).

As shown in FIG. 1, the conventional battery pack 100 includes only one kind of unit module 120 (a mechanical and electrical connection assembly having same kind of unit cells). However, the initial operating condition of a device is generally different from the intermediate operating condition of the device. As a result, the conventional battery pack 100 has a limit in that the conventional battery pack 100 cannot efficiently respond to those operating conditions.

At the present time, most battery packs include one kind of battery cells, i.e., large-capacity battery cells or high-output battery cells, as unit cells. However, these battery packs are not suitable for a system requiring high output for the starting torque and large capacity after the starting, like a motor. In other words, battery packs including only one kind of unit module cannot be used in a system requiring complex performance.

Consequently, a device (or a system) requiring complex operating modes needs a plurality of battery packs. In the case of using the plurality of battery packs, however, the spatial and time efficiencies and the safety are lowered. Furthermore, a high-level technology and a large amount of costs are needed to develop a battery cell itself satisfying all the characteristics.

In consideration of the above-described matter, it is urgently required to develop a novel battery pack that can be applied to a system requiring complex characteristics and has improved spatial efficiency.

In this connection, there has been known a technology using a fuel cell as a hybrid power supply unit. For example, Japanese Unexamined Patent Publication No. H6-124720 discloses a battery system including two or more storage batteries and a fuel cell. According to this battery system, power is supplied from one storage battery to the outside while power is supplied from the fuel cell to another storage battery such that the another storage battery can be charged, whereby stable power supply is accomplished. Although the battery system is a battery pack including a plurality of batteries, the principal component of the battery system is the fuel cell. As a result, the disclosed battery system cannot be efficiently operated depending upon the operating conditions of a device in which the battery system is mounted.

In addition, Japanese Unexamined Patent Publication No. 2004-111242 discloses a technology for directly connecting a high-output secondary battery and a large-capacity secondary battery in parallel with each other to construct a battery assembly and manufacturing a battery pack with the battery assembly. In this technology, however, different kinds of battery cells constitute one unit module, and therefore, the battery pack cannot be efficiently operated depending upon the operating conditions of a device in which the battery pack is mounted.

SUMMARY OF THE INVENTION

Therefore, the present invention has been made to solve the above-mentioned problems, and other technical problems that have yet to be resolved.

As a result of a variety of extensive and intensive studies and experiments to solve the problems as described above, the inventors of the present invention have found that, when a battery pack is constructed using unit modules having different characteristics, a current and/or voltage detection unit, a control unit, and a switching unit are electrically connected with each other in an appropriate fashion, and an optimal unit module is automatically selected and operated based on a current and/or voltage signal, the battery pack is very efficiently operated depending upon the operating conditions of a device in which the battery pack is mounted. The present invention has been completed based on these findings.

In accordance with one aspect of the present invention, the above and other objects can be accomplished by the provision of a battery pack comprising: a module assembly including two or more unit modules having different outputs and capacities; a detection unit for detecting the current and/or the voltage of the battery pack and transmitting the detected current signal and/or the detected voltage signal to a control unit; the control unit for selecting an optimal unit module from the module assembly based on the current signal and/or the voltage signal received from the detection unit; and a switching unit for electrically connecting a specific unit module of the module assembly to an external input and output terminal under the control of the control unit.

The module assembly includes two or more unit modules having different outputs and capacities. Alternatively, the module assembly may include a plurality of unit modules having different outputs and capacities depending upon the purpose of use of the battery pack.

As unit cells of the respective unit modules, there may be used, for example, nickel-metal hydride secondary batteries, nickel-cadmium (Ni—Cd) secondary batteries, and capacitors. According to circumstances, two or more of the above-specified ones may be combined to be used as the unit cells of the respective unit modules.

In a preferred embodiment, the module assembly includes a relatively high-output and small-capacity unit module and a relatively low-output and large-capacity unit module. Especially, this module assembly can be preferably used in a battery pack as a power source for vehicles or motors.

The high-output and small-capacity unit module means a unit module that has a relatively small internal resistance and provides instantaneously high output, whereas the low-output and large-capacity unit module means a unit module that has a relatively large internal resistance and provides large capacity although not providing high output. One of the characteristics of the present invention is that the unit modules having different characteristics as described above are combined so as to construct a battery pack.

When the battery pack is applied to a device which requires high output for the starting torque and large capacity after the starting, like a power source for vehicles or a motor, the high-output and small-capacity unit module is temporarily used during the initial operation, and therefore, the high-output and small-capacity unit module may have small capacity. However, it is required for the low-output and large-capacity unit module to continuously supply energy after the operation of the device is initiated, and therefore, it is preferable that the low-output and large-capacity unit module have large capacity. Here, the high and low of the output are relative concepts, and therefore, the magnitude of the output is not particularly restricted.

In a preferred embodiment, the relatively high-output and small-capacity unit module includes super capacitors and/or secondary batteries as the unit cells. Specifically, the high-output and small-capacity unit module may be constituted by either the super capacitors or the secondary batteries. According to circumstances, the high-output and small-capacity unit module may be constituted by a combination of the super capacitors and the secondary batteries. The super capacitors are based upon, for example, electric double-layer capacitors, pseudo capacitors and the like.

According to the present invention, the secondary battery may be preferably a lithium secondary battery. In the lithium secondary battery, it is possible to control the output and the capacity per weight depending upon the construction of a cathode active material, the construction of an anode active material, the shape of an electrode assembly, or the shape of the battery. Consequently, it is possible to easily construct a unit cell for the high-output and small-capacity unit module and a unit cell for the low-output and large-capacity unit module.

The capacitor is an element that accumulates electric charge when voltage is applied. The capacitor has high output characteristics. In a preferred embodiment, the capacitor may be an electric double-layer capacitor and/or a pseudo capacitor.

The electric double-layer capacitor is an element that charges ions on an electrolyte and electrons on an electrode in an electric double layer formed at the interface between the electrode and the electrolyte so as to store electric charge. The pseudo capacitor is an element that uses Faraday reaction to store electrons adjacent to the surface of an electrode material.

The electric double-layer capacitor includes an equivalent circuit in which a double-layer capacitance and an equivalent series resistance (ESR) are connected in series with each other. In this case, the double-layer capacitance is proportional to the surface area of the electrode, and the ESR is the sum of the resistance of the electrode, the resistance of an electrolytic solution, and the resistance of the electrolyte in pores of the electrode. The instantaneously high-output characteristics of the electric double-layer capacitor are excellent; however, the energy density and storage characteristics of the electric double-layer capacitor are poor as compared to the conventional secondary battery.

On the other hand, the battery pack according to the present invention includes two or more unit modules having different outputs and capacities, and therefore, the present invention eliminates the problems of the above-described super capacitor. For example, when a super capacitor is used as a unit cell for the high-output and small-capacity unit module, and a lithium secondary battery having high energy density and high discharge voltage is used as a unit cell for the low-output and large-capacity unit module, both the instantaneously high-output characteristics of the super capacitor and the high energy density characteristics of the lithium secondary battery are acquired.

The switching unit serves to electrically connect a specific unit module of the module assembly to the external input and output terminal under the control of the control unit. As the switching unit, there may be used, for example, a commercialized mechanical relay switch or an electric switch, such as a solid state relay or a semiconductor relay. Of course, various kinds of switches having different structures may be also used.

The detection unit serves to detect the current and/or the voltage of the battery pack and to transmit the detected information to the control unit. The detection unit detects the current and/or the voltage of the battery pack in real time or periodically. In the case of detecting the current of the battery pack, the detection unit may be a current detection unit. In the case of detecting the voltage of the battery pack, on the other hand, the detection unit may be a voltage detection unit. Preferably, both the current detection unit and the voltage detection unit may be included in the battery pack.

The kinds of the external input and output terminal (cathode terminal and anode terminal) are not particularly restricted so long as the current detection unit is disposed between the switching unit and the external input and output terminal. The voltage detection unit may be disposed between external input and output terminals, i.e., a cathode terminal and an anode terminal.

The control unit serves to select an optimal unit module from the module assembly based on the current and/or voltage signal received from the detection unit. The control unit may be included in the battery pack as an independent element. Alternatively, the control unit may be included in a battery management system (BMS). In addition, the BMS may further include a voltage detection unit for detecting the capacities of the respective unit modules.

In accordance with another aspect of the present invention, there is provided an operating method of the battery pack with above-stated construction. The operating method of the battery pack comprises: (a) controlling a switching unit such that a high-output and small-capacity unit module of a module assembly is connected to an external input and output terminal, by a control unit, when an external device is operated; (b) detecting the current and/or the voltage of the battery pack, by a detection unit, and transmitting the detected signal to the control unit; and (c) when the value calculated from the detected signal is less than a predetermined critical value, transmitting a signal to the switching unit, by the control unit, such that a low-output and large-capacity unit module is connected to the external input and output terminal.

The external device may include, but is not limited to, an electric vehicle (EV), a hybrid electric vehicle (HEV), a robot, an electric bicycle, and an electric scooter.

Because high output is required at the initial operation stage of the device as previously described, the control unit transmits a signal to the switching unit such that the high-output and small-capacity unit module of the module assembly is connected to the external input and output terminal. The switching unit turns on a corresponding switch such that a specific unit module can be connected to the external input and output terminal.

The detection unit monitors the current and/or the voltage of the battery pack in real time or periodically. When the detected current value and/or the detected voltage value has reached or exceeded a predetermined critical value, a feedback to the control unit is carried out. The control unit controls the switching unit to be operated such that the low-output and large-capacity unit module is connected to the external input and output terminal. The low-output and large-capacity unit module connected to the external input and output terminal continuously supplies energy to a load.

In addition, the operating method of the battery pack may further comprise, when the voltage of the low-output and large-capacity unit module, which is being operated, is less than a predetermined critical value, transmitting a corresponding signal to the switching unit, by the control unit, such that the high-output and small-capacity unit module is connected to the external input and output terminal.

The critical value, on which the selective operation of the two unit modules is based, may be appropriately decided in consideration of various factors, such as the conditions of the unit cells constituting the unit modules, the operating conditions of the device, etc.

According to the operating method as described above, an optimal unit module of the battery pack according to the present invention can be selected depending upon the operating conditions of the external device. Consequently, the battery pack according to the present invention is applied to a device in which required output is changed during the operation of the device, whereby the operating efficiency of the battery pack is improved. This efficient operation of the battery pack ultimately increase the service life of the respective unit modules and thus the service life of the battery pack. Furthermore, when the service life of a specific unit module has elapsed, it is possible to replace the worn unit module with a new one without disposal of the entirety of the battery pack. Consequently, the present invention is very economical.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF PREFERRED EMBODIMENTS

Now, preferred embodiments of the present invention will be described in detail with reference to the accompanying drawings. It should be noted, however, that the scope of the present invention is not limited by the illustrated embodiments.

Figure 1:
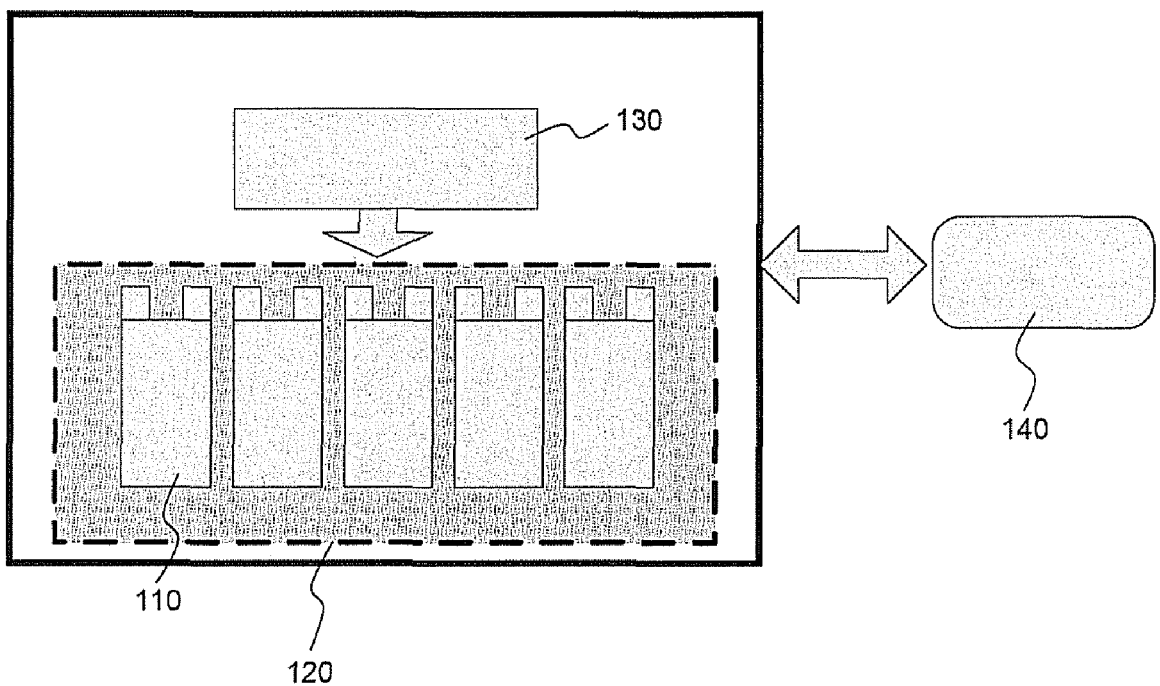
FIG. 1 is a typical view illustrating a conventional battery pack including unit modules having the same output and capacity characteristics.
Figure 2:
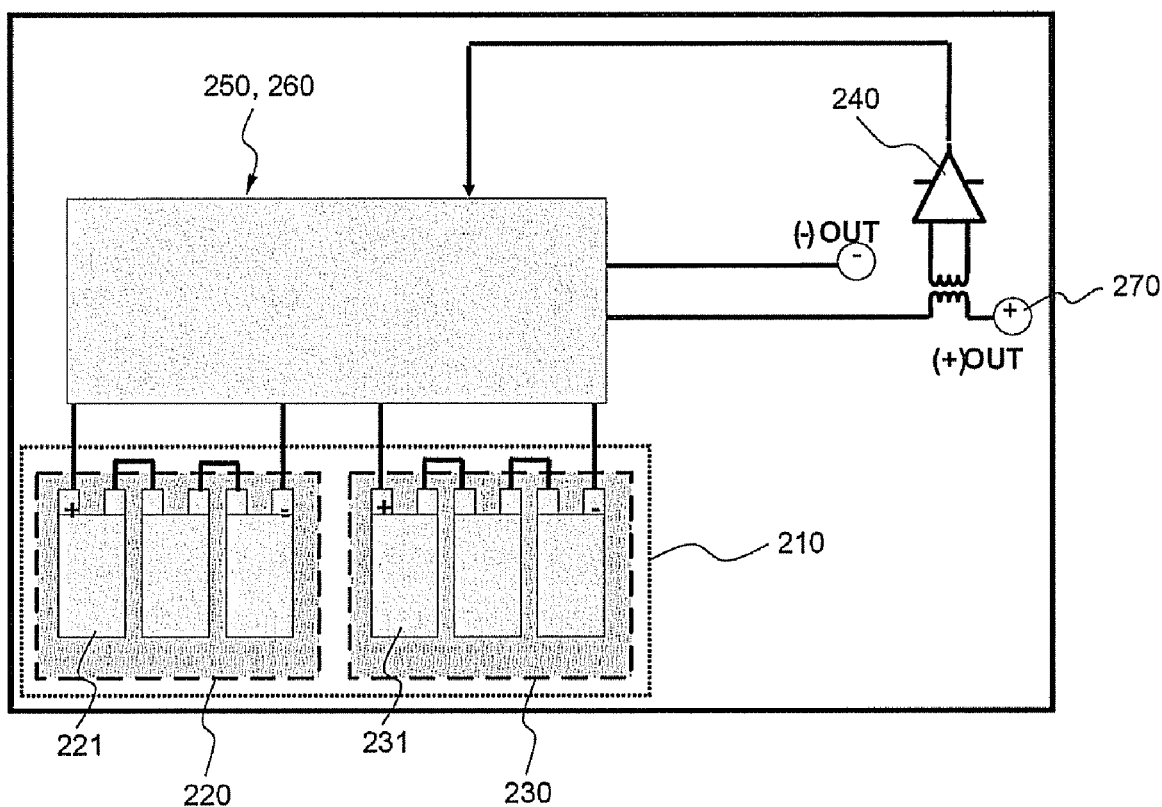
FIG. 2 is a typical view illustrating a battery pack including unit modules having different output and capacity characteristics according to a preferred embodiment of the present invention.

FIG. 2 is a typical view illustrating the structure of a battery pack including two unit modules having different output and capacity characteristics according to a preferred embodiment of the present invention.

Referring to FIG. 2, a battery pack 200 includes a module assembly 210, a current detection unit 240, a control unit 250, a switching unit 260, and an external input and output terminal 270. The module assembly 210 includes two unit modules 220 and 230, which have pluralities of battery cells 221 and 231, respectively. The first unit module 220 has a relatively high-output and small-capacity battery cells 221, whereas the second unit module 230 has a relatively low-output and large-capacity battery cells 231. The numbers of the battery cells 221 and 231 constituting the unit modules 220 and 230 may be different from each other. For example, the number of the battery cells 231 constituting the second unit module 230, which requires large capacity, is greater than that of the battery cells 221 constituting the first unit module 220.

The current detection unit 240, which is disposed between the switching unit 260 and the external input and output terminal 270, serves to monitor the current value of the battery pack 200 in real time or periodically and to transmit the monitored current value to the control unit 250.

The control unit 250, which controls the operations of the module assembly 210 and the switching unit 260, serves to compare the current value received from the current detection unit 240 with a predetermined critical value stored in the control unit 250 and to control the operations of the module assembly 210 and the switching unit 260 based on the result of the comparison. For example, when it is confirmed that a large amount of electric current is being outputted to the module assembly 210 based on the operation conditions of a device (not shown), the control unit 250 controls the switching unit 260 to be operated such that the first unit module 220 is connected to the external input and output terminal 270. When it is confirmed that a small amount of electric current is being outputted to the module assembly 210, on the other hand, the control unit 250 controls the switching unit 260 to be operated such that the second unit module 230 is connected to the external input and output terminal 270.

The operation of the control unit 250 may be constructed such that the operation of the control unit 250 can be further controlled by the device. The predetermined critical value may be also constructed such that the predetermined critical value can be changed by the device.

According to circumstances, the control unit 250 may be constructed such that the conditions of the respective unit modules 220 and 230 (for example, the degradation of some battery cells) can be checked by the control unit 250, and the check information can be confirmed from the outside. In addition, when a specific one of the unit modules (for example, the unit module 220) needs to be replaced, and the 10 continuous operation of the battery pack is required during the replacement of the specific unit module, the control unit 250 may control the switching unit 260 to be operated such that the unreplaced unit module 230 is connected to the external input and output terminal 270.

Figure 3:
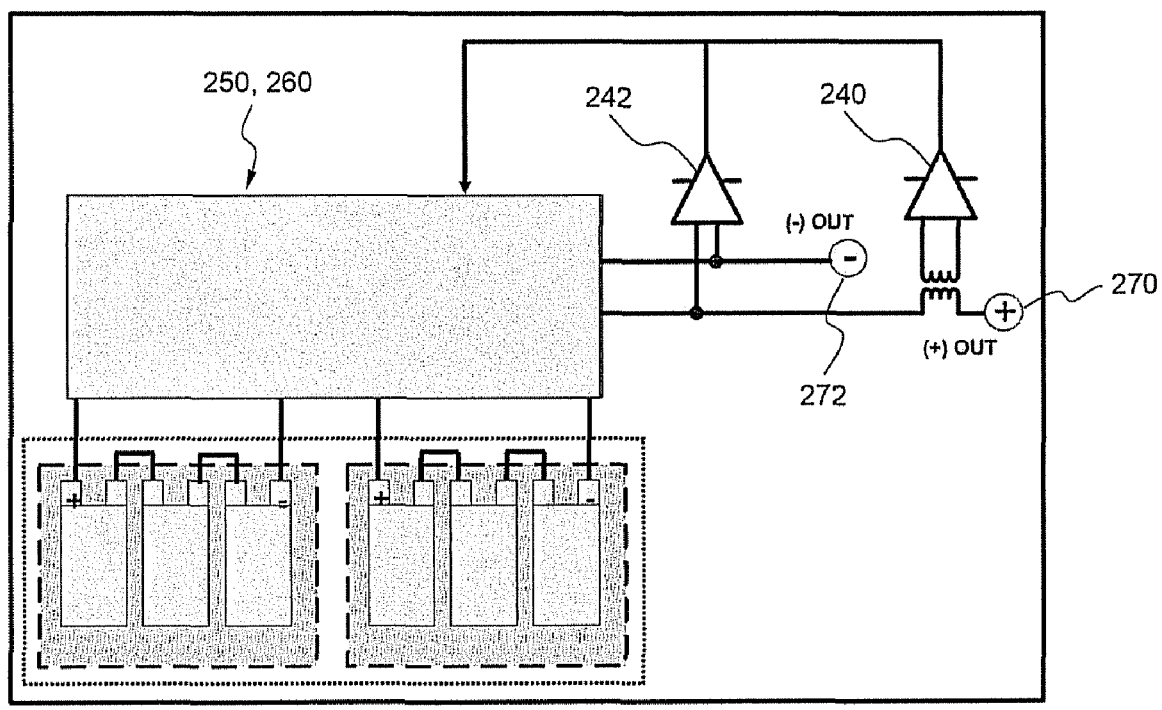
FIG. 3 is a typical view illustrating a battery pack according to another preferred embodiment of the present invention.

FIG. 3 is a typical view illustrating a battery pack according to another preferred embodiment of the present invention.

A battery pack 201 of FIG. 3 is different from the battery pack 200 of FIG. 2 in that a voltage detection unit 242 is further disposed between external input and output terminals 270 and 272 in addition to the current detection unit 240 disposed between the switching unit 260 and the external input and output terminal 270.

Consequently, the control unit 250 serves to compare the voltage value received from the voltage detection unit 242 in real time or periodically as well as the current value received from the current detection unit 240 with predetermined critical values stored in the control unit 250 and to control the operations of the module assembly 210 and the switching unit 260 based on the result of the comparison.

Other well-known components may be added to the battery pack according to the present invention depending upon applications of the present invention. Although the preferred embodiments of the present invention have been disclosed for illustrative purposes, those skilled in the art will appreciate that various modifications, additions and substitutions are possible, without departing from the scope and spirit of the invention as disclosed in the accompanying claims.

INDUSTRIAL APPLICABILITY

As apparent from the above description, the battery pack according to the present invention is constructed such that the battery pack includes unit modules having different characteristics and a specific one(s) of the unit modules is controlled to be operated under the optimal conditions. Consequently, the battery pack according to the present invention can be used to efficiently operate various systems, such as electric vehicles, hybrid electric vehicles, robots, electric bicycles, and electric scooters, requiring complex operating characteristics.

What is claimed is:

1. A battery pack comprising:
   a module assembly including two or more unit modules having different outputs and capacities;
   a detection unit for detecting the current and/or the voltage of the battery pack and transmitting the detected current signal and/or the detected voltage signal to a control unit;
   the control unit for selecting an optimal unit module from the module assembly based on the current signal and/or the voltage signal received from the detection unit; and
   a switching unit for electrically connecting a specific unit module of the module assembly to an external input and output terminal under the control of the control unit,
   wherein
   the module assembly includes a relatively high-output and small-capacity unit module, and a relatively low-output and large-capacity unit module, and
   the detection unit for detecting the voltage of the battery pack is a voltage detection unit which is disposed between two external input and output terminals.

2. The battery pack according to claim 1, wherein each of the unit modules includes nickel-metal hydride secondary batteries, nickel-cadmium (Ni-Cd) secondary batteries, capacitors and/or lithium secondary batteries as unit cells.

3. The battery pack according to claim 1, wherein the relatively high-output and small-capacity unit module includes super capacitors and/or secondary batteries as unit cells.

4. The battery pack according to claim 3, wherein the super capacitors are based upon electric double-layer capacitors and/or pseudo capacitors, and the secondary batteries are lithium secondary batteries.

5. The battery pack according to claim 1, wherein the switching unit is a mechanical relay switch or an electrical switch.

6. The battery pack according to claim 1, wherein the detection unit detects the current and/or the voltage of the battery pack in real time or periodically.

7. The battery pack according to claim 1, wherein the detection unit for detecting the current is a current detection unit which is disposed between the switching unit and the external input and output terminal.

8. The battery pack according to claim 1, wherein the control unit is included in a battery management system (BMS).

9. The battery pack according to claim 8, wherein the BMS further includes a voltage detection unit for detecting the capacities of the respective unit modules.

10. The battery pack according to claim 1, wherein the battery pack is used as a power source for electric vehicles, hybrid electric vehicles, robots, electric bicycles, or electric scooters.

* * * * *